United States Patent
Kim et al.

(10) Patent No.: US 10,253,223 B2
(45) Date of Patent: Apr. 9, 2019

(54) SEMICONDUCTOR DEVICE AND METHOD FOR MANUFACTURING THE SAME USING AN ADHESIVE

(71) Applicant: LG CHEM, LTD., Seoul (KR)

(72) Inventors: Jung Hak Kim, Daejeon (KR); Hee Jung Kim, Daejeon (KR); Se Ra Kim, Daejeon (KR); Kwang Joo Lee, Daejeon (KR); Seung Hee Nam, Daejeon (KR); Young Kook Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/752,666

(22) PCT Filed: Mar. 31, 2017

(86) PCT No.: PCT/KR2017/003578
§ 371 (c)(1),
(2) Date: Feb. 14, 2018

(87) PCT Pub. No.: WO2017/171492
PCT Pub. Date: Oct. 5, 2017

(65) Prior Publication Data
US 2018/0237667 A1  Aug. 23, 2018

(30) Foreign Application Priority Data

Mar. 31, 2016 (KR) .................. 10-2016-0039249
Mar. 31, 2017 (KR) .................. 10-2017-0041414

(51) Int. Cl.
*H01L 23/48* (2006.01)
*H01L 23/52* (2006.01)
(Continued)

(52) U.S. Cl.
CPC .......... *C09J 133/10* (2013.01); *C08G 59/621* (2013.01); *C09J 163/00* (2013.01); *C09J 163/04* (2013.01);
(Continued)

(58) Field of Classification Search
CPC ... C09J 133/10; C09J 163/04; H01L 23/3157; H01L 25/065; H01L 21/565; H01L 2224/16227; H01L 2924/181
See application file for complete search history.

(56) References Cited

U.S. PATENT DOCUMENTS 6,387,470 B1 * 5/2002 Chang .................... B60R 13/08
428/121
6,873,034 B2  3/2005 Nakamura et al.
(Continued)

FOREIGN PATENT DOCUMENTS

JP  2003-243637 A  8/2003
JP  2008-227079 A  9/2008
(Continued)

OTHER PUBLICATIONS

Search Report and Written Opinion issued for International Application No. PCT/KR2017/003578 dated Jul. 6, 2017 (12 pages).

*Primary Examiner* — Ismail A Muse
(74) *Attorney, Agent, or Firm* — Rothwell, Figg, Ernst & Manbeck, P.C.

(57) ABSTRACT

The present invention relates to a semiconductor device including: a first semiconductor element fixed onto an adherend by flip-chip connection; an adhesive layer for embedding a space between the adherend and the first semiconductor element and embedding the first semiconductor element; and a second semiconductor element connected to the first semiconductor element via the adhesive
(Continued)

layer, wherein the adhesive layer has a predetermined melt viscosity and thixotropic index.

20 Claims, 1 Drawing Sheet

(51) Int. Cl.
    *H01L 29/40*     (2006.01)
    *C09J 133/10*     (2006.01)
    *C09J 163/04*     (2006.01)
    *H01L 21/56*     (2006.01)
    *H01L 25/065*     (2006.01)
    *H01L 23/31*     (2006.01)
    *C08G 59/62*     (2006.01)
    *C09J 163/00*     (2006.01)

(52) U.S. Cl.
    CPC ........ *H01L 21/565* (2013.01); *H01L 23/3157* (2013.01); *H01L 25/065* (2013.01); *H01L 2224/16225* (2013.01); *H01L 2224/16227* (2013.01); *H01L 2924/181* (2013.01)

(56) References Cited

U.S. PATENT DOCUMENTS

| | | | |
|---|---|---|---|
| 8,436,479 B2 | 5/2013 | Sasaki | |
| 9,000,112 B2* | 4/2015 | Ryu | .................... C08K 9/06 526/317.1 |
| 2005/0288396 A1 | 12/2005 | Katayama et al. | |
| 2007/0187811 A1 | 8/2007 | Arai et al. | |
| 2008/0224324 A1 | 9/2008 | Kawada et al. | |
| 2009/0314532 A1* | 12/2009 | Hayashi | ................ C08G 59/38 174/258 |
| 2013/0164535 A1* | 6/2013 | Ryu | ........................ B32B 27/08 428/407 |
| 2013/0175485 A1* | 7/2013 | Kanamaru | ............... H01B 1/02 252/514 |
| 2013/0288057 A1* | 10/2013 | Ryu | ......................... C08K 9/06 428/404 |
| 2013/0330558 A1* | 12/2013 | Yoo | ....................... C08L 101/02 428/407 |
| 2014/0087157 A1* | 3/2014 | Yoo | ........................... B32B 7/02 428/213 |
| 2014/0255699 A1* | 9/2014 | Yoo | ....................... C08L 101/02 428/407 |
| 2015/0025171 A1* | 1/2015 | Yoo | ............................. C08J 5/00 522/112 |
| 2015/0303130 A1 | 10/2015 | Kim et al. | |
| 2016/0040048 A1* | 2/2016 | Sumita | ................... C09J 163/00 523/467 |
| 2016/0336290 A1 | 11/2016 | Kim et al. | |
| 2017/0158926 A1* | 6/2017 | Tsuda | .................. H01L 21/6836 |
| 2017/0198182 A1* | 7/2017 | Kim | ..................... C09D 163/00 |
| 2017/0233610 A1* | 8/2017 | Kim | ..................... C09D 163/00 428/220 |
| 2018/0118982 A1* | 5/2018 | Campbell | .................. C09J 9/00 |
| 2018/0237663 A1* | 8/2018 | Kim | ....................... C09J 11/04 |
| 2018/0265758 A1* | 9/2018 | Kim | ....................... C09J 163/10 |

FOREIGN PATENT DOCUMENTS

| | | |
|---|---|---|
| JP | 5277537 B2 | 8/2013 |
| KR | 10-2011-0082558 A | 7/2011 |
| KR | 10-2011-0124064 A | 11/2011 |
| KR | 10-1079068 B1 | 11/2011 |
| KR | 10-2015-0119613 A | 10/2015 |
| KR | 10-2015-0138766 A | 12/2015 |
| KR | 10-2016-0058711 A | 5/2016 |

\* cited by examiner

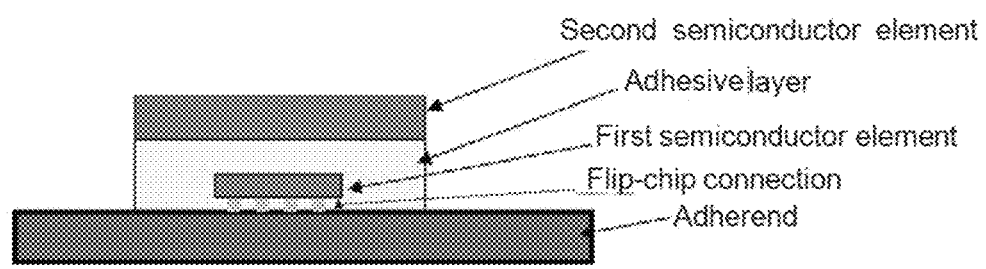

SEMICONDUCTOR DEVICE AND METHOD FOR MANUFACTURING THE SAME USING AN ADHESIVE

CROSS-REFERENCE TO RELATED APPLICATIONS

This application is a 35 U.S.C. 371 National Phase Entry Application from PCT/KR2017/003578, filed Mar. 31, 2017, claims the benefit of priorities from Korean Patent Application No. 10-2016-0039294 filed on Mar. 31, 2016 and Korean Patent Application No. 10-2017-0041414 filed on Mar. 31, 2017 with the Korean Intellectual Property Office, the disclosures of which are incorporated herein by reference in their entirety.

The present invention relates to a semiconductor device and a method for manufacturing a semiconductor device. More specifically, the present invention relates to a semiconductor device having a structure capable of greatly improving the efficiency of a semiconductor manufacturing process by obviating the need for the existing underfill process, and improving the signal transmission efficiency as well as the transmission speed, and to a method for manufacturing the semiconductor device.

BACKGROUND OF ART

Recently, as the tendency toward miniaturization, high functionalization, and large capacity of electronic equipment has been expanding and the need for densification and high integration of the semiconductor package has rapidly increased, the size of semiconductor chips has been becoming larger and larger. In terms of improvement of integration degree, the stack package method for stacking chips in multiple stages has gradually increased.

As for the stack packaging methods, a wire bonding method in which a wire of a metal such as gold or aluminum interconnects an electrode portion of a semiconductor pellet and a conductor layer disposed on a lead frame layer or stem, and a flip chip method that attaches a semiconductor chip by directly fusing an electrode pattern on its lower surface to a circuit board rather than using an additional link structure such as a metal lead (wire) or a separate medium such as a ball grid array (BGA), are known.

Meanwhile, in order to increase the ease of signal transmission of the semiconductor device and to control the operation of the semiconductor elements, a control semiconductor device (controller) is provided. However, the control semiconductor device, when fixed improperly, will lower the signal transmission efficiency or the transmission speed of the semiconductor package, destabilize the structure of the semiconductor device in the course of multistage stack packaging, and/or reduce the manufacturing yield and reliability of the semiconductor device.

Further, in order to protect integrated circuits (ICs) and similar devices, resin packaging is often carried out using various resins, mainly epoxy resin. Following the recent trend of miniaturization and weight reduction, the mainstream IC packaging method for packaging devices is called a surface mounting where ICs or other devices are mounted directly on a circuit board and liquid resin is utilized for packaging (under-fill process).

Such under-fill process attempts to solve the issue of thermomechanical fatigue. Specifically, the under-fill process includes filling a polymeric material that has excellent adhesion such as epoxy resin with inorganic particles so as to have a value close to the thermal expansion coefficient of the solder, and then applying the preparation to fill the gap between the chip and the printed circuit board. Here, the applied polymer composite material filled with the inorganic particles is called an underfill.

Generally known underfill materials being in liquid form cause underfill with high flowability to protrude to undesired portions of the device, resulting in unnecessary contamination, product defects, and/or difficulty in mounting at a high density.

It is known to form a preventive barrier or dam around the device.

DETAILED DESCRIPTION OF THE INVENTION

Technical Problem

It is an object of the present invention to provide a semiconductor device having a structure capable of greatly improving the efficiency of a semiconductor manufacturing process by obviating the need for the existing underfill process, and improving the signal transmission efficiency as well as the transmission speed.

It is another object of the present invention to provide a method for manufacturing a semiconductor device having a structure capable of greatly improving the efficiency of a semiconductor manufacturing process by obviating the need for the existing underfill process, and improving the signal transmission efficiency as well as the transmission speed.

Technical Solution

In order to achieve the objects, there is provided a semiconductor device including: a first semiconductor element fixed onto an adherend by flip-chip connection; an adhesive layer for embedding a space between the adherend and the first semiconductor element and embedding the first semiconductor element; and a second semiconductor element connected to the first semiconductor element via the adhesive layer, wherein the adhesive layer has a melt viscosity of 10 to 10,000 Pa·s at a temperature of 110° C. and a shear rate of 5 rad/s, and wherein a thixotropic index defined by a ratio of the melt viscosity of the adhesive layer at a shear rate of 0.5 rad/sec and a temperature of 110° C. to the melt viscosity of the adhesive layer at a shear rate of 5 rad/sec and a temperature of 110° C. is 1.5 to 7.5.

Further, there is also provided a method for manufacturing a semiconductor device including the steps of: embedding a space between an adherend and a first semiconductor element fixed onto the adherend by flip-chip connection and embedding the first semiconductor element with an adhesive for a semiconductor; and bonding the second semiconductor element onto the adhesive for a semiconductor, wherein the adhesive layer has a melt viscosity of 10 to 10,000 Pa·s at a temperature of 110° C. and a shear rate of 5 rad/s, and wherein a thixotropic index defined by a ratio of the melt viscosity of the adhesive layer at a shear rate of 0.5 rad/sec and a temperature of 110° C. to the melt viscosity of the adhesive layer at a shear rate of 5 rad/sec and a temperature of 110° C. is 1.5 to 7.5.

Hereinafter, a semiconductor device and a method for manufacturing a semiconductor device according to specific embodiments of the present invention will be described in more detail.

According to one embodiment of the present invention, there may be provided a semiconductor device including: a first semiconductor element fixed onto an adherend by flip-chip connection; an adhesive layer for embedding a space between the adherend and the first semiconductor element and embedding the first semiconductor element; and a second semiconductor element connected to the first semiconductor element via the adhesive layer, wherein the adhesive layer has a melt viscosity of 10 to 10,000 Pa·s at a temperature of 110° C. and a shear rate of 5 rad/s, and wherein a thixotropic index defined by a ratio of the melt viscosity of the adhesive layer at a shear rate of 0.5 rad/sec and a temperature of 110° C. to the melt viscosity of the adhesive layer at a shear rate of 5 rad/sec and a temperature of 110° C. is 1.5 to 7.5.

The present inventors have found that, by embedding a space between an adherend and a first semiconductor element fixed onto the adherend by flip-chip connection and embedding the first semiconductor element by using an adhesive layer having a specific melt viscosity, it is possible to manufacture a semiconductor device having a structure capable of greatly improving the efficiency of a semiconductor manufacturing process by obviating the need for the existing underfill process, and improving the signal transmission efficiency as well as the transmission speed, thereby completing the present invention.

Specifically, as an adhesive layer having a melt viscosity of 10 to 10,000 Pa·s or a melt viscosity of 40 to 5000 Pa·s at a temperature of 110° C. and a shear rate of 5 rad/sec is used, a space between an adherend and a first semiconductor element fixed onto the adherend by flip-chip connection can be more easily embedded. In addition, in the bonding process of the second semiconductor element, when the shearing force is applied while the adhesive layer is in contact with the first semiconductor element, the flowability of the adhesive layer is increased, and thereby the first semiconductor element can be more effectively and efficiently embedded.

Further, when the adhesive layer satisfies the above-described physical properties, it is possible to use a space between an adherend and a first semiconductor element fixed onto the adherend by flip-chip connection, and the embedding can be performed by using only the above-mentioned adhesive layer without using any other material for embedding the second semiconductor element.

Accordingly, the adhesive layer for embedding a space between the adherend and the first semiconductor element and embedding the first semiconductor element may be a continuous phase.

The term "continuous phase" means that as the space between the adherend and the first semiconductor element, and the first semiconductor element, are simultaneously or sequentially embedded through the same material, they are not distinguished into individual layers in the final product.

For example, a component forming the adhesive layer may be used together for embedding the space between the adherend and the first semiconductor element, and embedding the first semiconductor element.

Further, even if the space between the adherend and the first semiconductor element, and the first semiconductor element, are simultaneously or sequentially embedded using the component forming the adhesive layer, the adhesive layer may be a continuous phase.

More specifically, if the melt viscosity of the adhesive layer showing at a temperature of 110° C. and a shear rate of 5 rad/sec is too low, an adhesive may flow out around the edges of the second semiconductor element in a process of connecting (die-bonding) the first semiconductor element and the second semiconductor element via the adhesive layer, resulting in formation of fillets.

In addition, if the melt viscosity of the adhesive film at a temperature of 110° C. and a shear rate of 5 rad/sec is too high, flowability may decrease, making it difficult to embed a space between the adherend and the first semiconductor element fixed by flip-chip connection or to fix or embed between the first semiconductor element and the second semiconductor element, or the warpage of the second semiconductor element may become large, so that additional multilayer stacking may become difficult.

The term "embedding" refers to a state in which the outer surface of the semiconductor element is covered or coated with the adhesive film so that a part exposed to the outside is not substantially present.

Further, a thixotropic index defined by a ratio of the melt viscosity of the adhesive layer at a shear rate of 0.5 rad/sec and a temperature of 110° C. to the melt viscosity of the adhesive layer at a shear rate of 5 rad/sec and a temperature of 110° C. may be 1.5 to 7.5 or 2.0 to 7.

The thixotropic index is a ratio of the melt viscosity of the adhesive layer at a shear rate of 0.5 rad/sec and a temperature of 110° C. to the melt viscosity of the adhesive layer at a shear rate of 5 rad/sec and a temperature of 110° C.

The thixotropic index of the adhesive layer at 110° C. may be 1.5 to 7.5, or 2.0 to 7.

If the thixotropic index of the adhesive layer at 110° C. is less than 1.5, the adhesive layer may flow when the second semiconductor element is fixed by using the adhesive layer, and the reliability of the manufacture of the semiconductor device may be significantly reduced.

In addition, if the thixotropic index of the adhesive layer at 110° C. is greater than 7.5, the initial viscosity at the time of die bonding using the adhesive layer may become too high to embed the first semiconductor element, and the warpage of the second semiconductor element after die bonding can be generated.

The thixotropic index of the adhesive layer is determined by a method of adjusting or changing the main components contained in the adhesive layer, a method of adjusting the content of the inorganic filler that can be optionally included with the main components of the adhesive layer, a method of adding a rheology modifier at the time of manufacturing the adhesive layer, and the like.

The first semiconductor element and the second semiconductor element may each have a thickness of 10 μm to 500 μm, 15 μm to 100 μm, or 15 μm to 80 μm.

The distance from one surface of the adherend to one surface of the second semiconductor element may be 10 μm to 1000 μm, 15 μm to 500 μm, or 20 μm to 300 μm.

Further, the distance from one surface of the first semiconductor element to one surface of the second semiconductor element may be 5 μm to 300 μm, or 10 μm to 200 μm.

Meanwhile, the adhesive layer has a melt viscosity of 10 to 10,000 Pa·s at a temperature of 110° C. and a shear rate of 5 rad/s, and a thixotropic index defined as the ratio of the melt viscosity of the adhesive layer at a shear rate of 0.5 rad/sec and a temperature of 110° C. to the melt viscosity of the adhesive layer at a shear rate of 5 rad/sec and a temperature of 110° C. may be 1.5 to 7.5. It may include a thermoplastic resin, an epoxy resin, and a curing agent including a phenol resin, while satisfying the conditions relating to the melt viscosity and the thixotropic index.

Examples of the thermoplastic resin may include, but are not limited to, polyimide, polyether imide, polyester imide, polyamide, polyether sulfone, polyether ketone, polyolefin, polyvinyl chloride, phenoxy, reactive butadiene acrylate nitrile copolymer rubber, (meth)acrylate-based resin, mixtures of two or more thereof, or copolymers of two or more thereof.

The thermoplastic resin may include a (meth)acrylate-based resin including a (meth)acrylate-based repeating unit containing an epoxy-based functional group.

Specifically, the (meth)acrylate-based resin may be a (meth)acrylate-based resin including a (meth)acrylate-based repeating unit containing an epoxy-based functional group and having a glass transition temperature of −10° C. to 30° C.

The (meth)acrylate-based resin may include 0.1 to 25% by weight of a (meth)acrylate-based repeating unit containing epoxy-based functional groups.

The epoxy-based functional group may include an epoxy group or a glycidyl group.

Meanwhile, the adhesive layer may include a thermoplastic resin having a glass transition temperature of −10° C. to 30° C., two or more kinds of liquid epoxy resins having different viscosities, and a curing agent including a phenol resin.

When the adhesive contains two or more kinds of liquid epoxy resins having different viscosities together with the thermoplastic resin and the curing agent containing a phenol resin, it is possible to facilitate embedding a space between an adherend and a first semiconductor element fixed onto the adherend by flip-chip connection and embedding the first semiconductor element, or fixing between the first semiconductor element and the second semiconductor element. In addition, it is possible to prevent a phenomenon in which an adhesive may flow out around the edges of the second semiconductor element in a process of connecting (die-bonding) the first semiconductor element and the second semiconductor element, resulting in formation of fillets.

The two or more kinds of liquid epoxy resins having different viscosities may include two or more kinds of liquid epoxy resins having different viscosity ranges.

More specifically, the two or more kinds of liquid epoxy resins having different viscosities may include a low viscosity liquid epoxy resin having a melt viscosity of 1 mPa·s to 500 mPa·s at 25° C.

In addition, the two or more kinds of liquid epoxy resins having different viscosities may include a high viscosity liquid epoxy resin having a melt viscosity of from 1000 mPa·s to 20,000 mPa·s at 25° C.

Further, the two or more kinds of liquid epoxy resins having different viscosities may further include a liquid epoxy resin in addition to the low viscosity liquid epoxy resin and the high viscosity liquid epoxy resin described above.

More specifically, the adhesive layer may include a low viscosity liquid epoxy resin having a melt viscosity of 1 mPa·s to 500 mPa·s at 25° C. and a high viscosity liquid epoxy resin having a melt viscosity of 1000 mPa·s to 20,000 mPa·s at 25° C. in a weight ratio of 1:10 to 10:1, or in a weight ratio of 2:8 to 8:2.

If the content of the low viscosity liquid epoxy in the adhesive layer is too high, a fillet may be generated around the periphery of the second semiconductor element or the generated amount thereof may be increased.

In addition, if the low viscosity liquid epoxy content in the adhesive layer is too low, the embedding property of the first semiconductor element and a bump may be lowered.

Meanwhile, the adhesive layer may further include a solid epoxy resin together with a liquid epoxy resin, so that the above-mentioned properties of the adhesive layer can be realized more easily.

Further, when the solid epoxy resin and the liquid epoxy resin are used together, it is possible to easily adjust the degree of curing of the adhesive layer, thereby increasing the adhesive performance. In addition, the thixotropic index of the adhesive layer at 110° C. can be adjusted to 1.5 to 7.5.

In addition, when the solid epoxy resin and the liquid epoxy resin are used together, the adhesive layer may have appropriate flowability. For example, the adhesive layer may have a melt viscosity of 10 to 10,000 Pa·s at a temperature of 110° C. and a shear rate of 5 rad/sec.

The liquid epoxy resin may form a substrate (or matrix) of an adhesive component together with the thermoplastic resin having a glass transition temperature of −10° C. to 30° C. and the curing agent including the phenol resin. The liquid epoxy resin allows the adhesive layer to have excellent adhesion and flow characteristics that are optimized for semiconductors while having a relatively low viscosity, and further to have a high breaking strength and low breaking elongation.

Specific examples of the solid epoxy resin may include at least one polymer resin selected from the group consisting of biphenyl-based epoxy resin, a bisphenol A epoxy resin, a bisphenol F epoxy resin, a cresol novolac epoxy resin, a phenol novolac epoxy resin, a tetrafunctional epoxy resin, a triphenolmethane-type epoxy resin, an alkyl modified triphenolmethane-type epoxy resin, a naphthalene-type epoxy resin, a dicyclopentadiene-type epoxy resin, and a dicyclopentadiene modified phenol-type epoxy resin.

A softening point of the solid epoxy resin may be 50° C. to 120° C.

When the softening point of the solid epoxy resin is too low, the adhesive strength of the resin composition for semiconductor adhering can be excessively high.

If the softening point of the solid epoxy resin is too high, the semiconductive layer can have low flowability at a high temperature and the adhesion strength can be lowered.

The solid epoxy resin may have an epoxy equivalent of 100 to 1000.

The phenol resin can have a softening point of 60° C. or higher, or from 60° C. to 160° C.

When the phenol resin having a softening point of 60° C. or higher is used, the substrate (or matrix) of the adhesive component can be formed together with the liquid epoxy resin and the thermoplastic resin having a glass transition temperature of −10° C. to 30° C. The adhesive layer has a higher tensile modulus and excellent adhesion strength at room temperature, and has flow characteristics that are optimized for semiconductors.

In particular, the weight ratio of the two or more kinds of liquid epoxy resins having different viscosities to the phenol resin may be 0.3 to 1.5.

If the weight ratio of the liquid epoxy resin to the phenol resin is too high, the adhesive layer may have adhesive properties at room temperature due to a decrease in the melt viscosity. Further, the tensile modulus at room temperature is lowered, and the elongation can be greatly increased.

In addition, if the weight ratio of the liquid epoxy resin to the phenol resin is too low, the modulus generated upon elongation at room temperature becomes very high, or the elongation at room temperature is greatly reduced, and thereby the yield of the final product may be greatly reduced.

The liquid epoxy resin may include at least one selected from the group consisting of a biphenyl-based epoxy resin, a bisphenol A epoxy resin, a bisphenol F epoxy resin, a cresol novolac epoxy resin, a phenol novolac epoxy resin, a tetrafunctional epoxy resin, a triphenolmethane-type epoxy resin, an alkyl modified triphenolmethane-type epoxy resin, a naphthalene-type epoxy resin, a dicyclopentadiene-type epoxy resin, and a dicyclopentadiene modified phenol-type epoxy resin.

The curing agent may further include at least one compound selected from the group consisting of an amine-based curing agent and an acid anhydride-based curing agent.

The adhesive layer may further include a curing catalyst.

The curing catalyst serves to accelerate the action of the curing agent or the curing of the adhesive layer, and a curing catalyst known to be used in the production of a semiconductor adhesive layer or the like can be used without particular limitation.

For example, as the curing catalyst, at least one selected from the group consisting of a phosphorous-based compound, a boron-based compound, a phosphorus-boron-based compound, and an imidazole-based compound may be used.

As described above, the thixotropic index of the adhesive layer can be controlled by adding a rheology modifier when preparing the adhesive layer.

When the rheological modifier is used, even if the material is not chemically bonded when shearing force is not applied, a net structure can be formed to maintain the shape, and when the shearing force is applied, collapse of the network structure may occur.

Therefore, the adhesive layer can maintain its shape without flowing when the shearing force is not applied before or after die bonding, and when the shearing force is applied to the adhesive resin during die bonding, the flowability is increased, thereby providing physical properties and performance that are advantageous for embedding properties.

Specifically, the adhesive layer may further include at least one selected from the group consisting of inorganic fillers and rheology modifiers.

The kind of the inorganic filler that can be included in the adhesive layer is not particularly limited, and general organic fillers or inorganic fillers can be used, but inorganic fillers can be preferably used.

Specific examples of the inorganic filler may include silica with a diameter of 100 nm or greater (e.g., wet silica with a diameter of 100 nm or greater), alumina, barium sulfate, and the like. An ion absorbent capable of absorbing ionic impurities to improve reliability may be used as the inorganic filler.

The ion absorbent is not particularly limited, and magnesium-based compounds such as magnesium hydroxide, magnesium carbonate, magnesium silicate, and magnesium oxide, calcium-based compounds such as calcium silicate, calcium carbonate, and calcium oxide, aluminum-based compounds such as alumina, aluminum hydroxide, aluminum nitride, and aluminum borate whiskers, zirconium-based compounds, and antimony bismuth-based compounds, or any mixtures of at least two thereof may be used as the ion absorbent.

As the rheology modifier that can be included in the adhesive layer, components known in the related art can be used. For example, fine milled synthetic silica such as silica with a diameter of less than 100 nm (e.g., dry silica with a diameter of less than 100 nm), bentonites, ultra-fine precipitated calcium carbonates, organic bentonites, surface-treated calcium carbonates, metal soaps, hydrogenated castor oils, polyamide waxes, polyethylene oxides, vegetable oils, polymer oils, flaxseed polymer oils, fatty acid dimers, or any mixtures of at least two thereof can be used.

More specific examples of these rheology modifiers may include the trade name "CAB-O-SIL" available from Cabot Corp., Boston, Mass., USA, and the trade name "AEROSIL" available from Evonik Industries, Essen, Germany, or the like. For example, the adhesive layer includes 10 to 50% by weight of the inorganic filler.

When the adhesive layer includes an inorganic filler, the inorganic filler can be included in an appropriate amount in consideration of thixotropic index, flowability, and embedding properties of the adhesive layer. For example, the adhesive layer may include 10 to 50% by weight of the inorganic filler.

Further, even when the adhesive layer includes a rheological modifier, the rheological modifier may be contained in an appropriate amount in consideration of thixotropic index, flowability, and embedding properties of the adhesive layer. For example, the adhesive layer may include 0.1 to 15% by weight of the rheological modifier.

However, when the content of the rheology modifier in the adhesive layer becomes excessive, not only does the non-dispersed state occur during production of the coating solution, but also the viscosity of the adhesive layer rapidly increases, so that the embedding properties can be greatly reduced.

In addition, when the adhesive layer includes an inorganic filler and a rheological modifier together, the sum of the weights of the inorganic filler and the rheological modifier may be 5 to 50% by weight of the adhesive layer.

As a material of the adherend to which the first semiconductor element is fixed by flip-chip connection, a substrate, a lead frame, another semiconductor element, or the like can be mentioned.

As the substrate, a conventionally known substrate such as a printed circuit board can be used. In addition, the lead frame may be a metal lead frame such as a Cu lead frame or an Alloy 42 lead frame or an organic substrate including glass epoxy, bismaleimide-triazine (BT), polyimide, or the like.

However, the material of the adherend is not limited to the above, and any circuit board which can be used by mounting a semiconductor element and electrically connecting the semiconductor element to a semiconductor element can be used without particular limitation.

According to another embodiment of the present invention, there is provided a method of manufacturing a semiconductor device, including the steps of: embedding a space between an adherend and a first semiconductor element fixed onto the adherend by flip-chip connection, arid embedding the first semiconductor element, with an adhesive for a semiconductor; and bonding the second semiconductor element to the adhesive for a semiconductor, wherein the adhesive for a semiconductor has a melt viscosity of 10 to 10,000 Pa·s at a temperature of 110° C. and a shear rate of 5 rad/s, and wherein a thixotropic index defined as the ratio of the melt viscosity of the adhesive layer at a shear rate of 0.5 rad/sec arid a temperature of 110° C. to the melt viscosity of the adhesive layer at a shear rate of 5 rad/sec and a temperature of 110° C. is 1.5 to 7.5.

As described above, through a method of embedding a space between an adherend and a first semiconductor element fixed onto the adherend by flip-chip connection and embedding the first semiconductor element by using the adhesive for a semiconductor satisfying the melt viscosity and the thixotropic index, it is possible to manufacture a semiconductor device having a structure capable of greatly improving the efficiency of a semiconductor manufacturing process by omitting the existing underfill process, and that is capable of improving the signal transmission efficiency and speed.

As an adhesive for a semiconductor having a melt viscosity of 10 to 10,000 Pa·s or a melt viscosity of 40 to 5000 Pa·s at a temperature of 110° C. and a shear rate of 5 rad/sec is used, a space between an adherend and a first semiconductor element fixed onto the adherend by flip-chip connection can be more easily embedded. In addition, in the bonding process of the second semiconductor element, when the shearing force is applied while the adhesive for a semiconductor is in contact with the first semiconductor element, the flowability of the adhesive layer is increased, and thereby the first semiconductor element can be more effectively and efficiently embedded.

The thixotropic index defined as the ratio of the melt viscosity of the adhesive for a semiconductor at a shear rate of 0.5 rad/sec and a temperature of 110° C. to the melt viscosity of the adhesive for a semiconductor at a shear rate of 5 rad/sec and a temperature of 110° C. may be 1.5 to 7.5, or 2.0 to 7.

The thixotropic index of the adhesive for a semiconductor at 110° C. is from 1.5 to 7.5, or from 2.0 to 7.

When the thixotropic index of the adhesive for a semiconductor at 110° C. is less than 1.5, the adhesive layer may flow when the second semiconductor element is fixed by using the adhesive for a semiconductor, and the reliability of the manufacture of the semiconductor device may be greatly reduced.

In addition, if the thixotropic index of the adhesive for a semiconductor at 110° C. is greater than 7.5, the initial viscosity at the time of die bonding using the adhesive for a semiconductor may become too high to embed the first semiconductor element, and warpage of the second semiconductor element after die bonding can be generated.

The manufactured semiconductor device can be the semiconductor device of the embodiment, and details of the manufacturing method of the embodiment include all the contents described above with respect to the semiconductor device of the embodiment.

Meanwhile, in the manufacturing method of the semiconductor device of the embodiment, the step of embedding a space between an adherend and a first semiconductor element fixed onto the adherend by the flip-chip connection and embedding the first semiconductor element with the adhesive for a semiconductor includes a step of simultaneously or sequentially embedding a space between the adherend and the first semiconductor element and embedding the first semiconductor element using only the adhesive for a semiconductor.

As a space between the adherend and the first semiconductor element and the first semiconductor element are simultaneously or sequentially embedded through the adhesive for a semiconductor, it is not distinguished as a separate layer inside the adhesive layer in the final product.

More specifically, the step of simultaneously or sequentially embedding a space between the adherend and the first semiconductor element and embedding the first semiconductor element using only the adhesive for a semiconductor includes a step of bonding the second semiconductor element to the adhesive for a semiconductor while a space between the adherend and the first semiconductor element fixed onto the adherend by the flip-chip connection and the first semiconductor element with the adhesive for a semiconductor, and then curing it at high temperature/high pressure in a pressurized oven. Through this step, the periphery of the solder bump of the first semiconductor element, i.e., a space between the first semiconductor element and the adherend, can be embedded with an adhesive layer of the semiconductor element.

Meanwhile, a sealing step is a step of sealing the semiconductor device with the adhesive for a semiconductor and the adhesive layer formed therefrom.

Such sealing step can be performed to protect the first semiconductor elements that are mounted on the adherend and the flip chip formed between the first semiconductor element and the adherend.

In the case of utilizing the above-mentioned flip chip, a first semiconductor element is fixed to the adherend by flip-chip connection, and the circuit surface of the first semiconductor element faces the adherend, which is so-called face down mounting.

A plurality of protruded electrodes such as bumps are provided in the first semiconductor element, and the protruded electrodes and the electrodes on the adherend are connected.

As described above, the adhesive layer described above is filled between the adherend and the first semiconductor element instead of a conventional underfill material.

The above connection method is not particularly limited, and it can be connected by a conventionally known flip-chip bonder.

For example, the protruded electrodes such as bumps that are formed in the first semiconductor element may be contacted and pressed against an electrically conductive material (lead solder or the like) for bonding that is attached to a connection pad of the adherend, and the electrically conductive material is melted to ensure electrical conduction between the first semiconductor element and the adherend and to fix the first semiconductor element to the adherend (flip-chip bonding).

In general, the heating condition of flip-chip bonding is 240 to 300° C., and the pressurizing condition is 0.5 to 490 N.

The material that is used when the bump is formed as the protruded electrodes is not particularly limited, and examples thereof include solders (alloys) such as a tin-lead-based metal material, a tin-silver-based metal material, a tin-silver-copper-based metal material, a tin-zinc-based metal material, and a tin-zinc-bismuth-based metal material; a gold-based metal material; and a copper-based metal material.

A conventionally known liquid or film-like underfill material can be used as the underfill material.

In the step of embedding the first semiconductor element, an adhesive layer for embedding is attached to the second semiconductor element, and die bonding is performed on the first semiconductor element.

In this step, the adhesive layer molds the first semiconductor element and simultaneously is in contact with the adherend at the periphery of the first semiconductor element.

As described above, the step of simultaneously or sequentially embedding a space between the adherend and the first semiconductor element and embedding the first semiconductor element using only the adhesive for a semiconductor includes a step of bonding the second semiconductor element onto the adhesive for a semiconductor while a space between an adherend and a first semiconductor element fixed onto the adherend by the flip-chip connection and the first semiconductor element are embedded with the adhesive for a semiconductor, and then curing it at high temperature/high pressure in a pressurized oven. Through this step, the periphery of the solder bump of the first semiconductor element, i.e., a space between the first semiconductor element and the adherend, can be embedded with an adhesive layer of the semiconductor element.

The heat treatment may be performed at a temperature of 50° C. to 200° C. under a pressure of 0.01 to 1.0 MPa, preferably at a temperature of 90° C. to 180° C. under a pressure of 0.1 to 0.8 MPa.

In addition, the heat treatment may be performed for 0.1 to 10 h, preferably 0.5 to 7 h.

After the sealing step, a post-curing step of post-curing the sealing resin may be performed.

In the post-curing step, any sealing resin that is insufficiently cured in the sealing step is completely cured.

The heating temperature in the post-curing step varies depending on the kind of the sealing resin, but it is, for example, in the range of 165 to 185° C., and the heating time is about 0.5 to 8 h.

A semiconductor package can be fabricated by undergoing a sealing step or a post-curing step.

Advantageous Effects

According to the present invention, there may be provided a semiconductor device having a structure capable of greatly improving the efficiency of a semiconductor manufacturing process by obviating the need for the existing underfill process and improving the signal transmission efficiency as well as the transmission speed, and a method for manufacturing the semiconductor device.

BRIEF DESCRIPTION OF THE DRAWING

FIG. 1 schematically shows a cross-section of a semiconductor device manufactured in an embodiment of the present invention.

DETAILED DESCRIPTION OF THE EMBODIMENTS

Hereinafter, preferred examples are presented to aid in understanding of the present invention. However, these examples are provided for illustrative purposes only, and the scope of the present invention is not limited thereto.

PREPARATION EXAMPLE

Preparation of Thermoplastic Acrylate Resin 40 g of butyl acrylate, 60 g of ethyl acrylate, 15 g of acrylonitrile, and 10 g of glycidyl methacrylate were mixed with 100 g of toluene, and the mixture was reacted at 80 CC for about 12 h to synthesize an acrylate-based resin (weight average molecular weight of 700,000 and glass transition temperature of 10° C.) having an introduced glycidyl group as a branched chain.

Examples 1 to 5 and Comparative Examples 1 to 3

Preparation of Resin Compositions for Bonding Semiconductors and Semiconductor Device Example 1

(1) Preparation of Resin Composition Solutions for Bonding Semiconductors 50 g of a phenol resin KH-6021 (DIC Corporation, bisphenol A novolac resin, hydroxyl group equivalent of 121 g/eq, softening point: 133 CC) which is a curing agent for epoxy resin, 40 g of a high viscosity liquid epoxy resin RE-310S (Nippon Kayaku, bisphenol A epoxy resin, epoxy equivalent of 180 g/eq, viscosity [25° C.]: 15,000 mPa·s), 26 g of a low viscosity liquid epoxy resin SEJ-01R (Nippon Kayaku, epoxy equivalent of 130 g/eq, viscosity [25° C], 250 mPa·s), 20 g of the thermoplastic acrylate resin obtained in Preparation Example 1, 1 g of a silane coupling agent (KBM-403, Shin-Etsu Chemical, gamma-glycidoxypropyltrimethoxysilane), 0.2 g of a curing accelerator 2PZ (Shikoku Kasei, 2-phenylimidazole) and 50 g of a filler SC-2050 (Admatech, spherical silica, average particle size of about 400 nm) were mixed in a methyl ethyl ketone solvent to obtain a resin composition solution for bonding semiconductors (solid content concentration of 40 wt %).

(2) Preparation of Adhesive Layers for Semiconductors

The prepared resin composition solutions for bonding semiconductors were coated on a release-treated polyethylene terephthalate film (thickness 38 μm) and dried at 110° C. for 3 min to obtain adhesive layers for semiconductors with a thickness of about 110 μm.

(3) Preparation of Semiconductor Devices

A first semiconductor element (with a square shape having sides of 5 mm and a thickness of 50 μm) including 24 lead-free solder bumps having a height of 40 μm with a pitch of 0.5 mm was bonded to the BGA substrate using a flip chip bonder.

Herein, the bonding was performed at a temperature of 250° C. and a pressure of 50 N for 10 second.

Subsequently, each of the adhesive layers produced in the respective examples and comparative examples was adhered to a semiconductor chip having a square shape with sides of 10 mm and a thickness of 80 μm under the condition of a temperature of 70° C.

In addition, the second semiconductor element to which the adhesive layer was attached was bonded to the first semiconductor element arid the BGA substrate to embed the first semiconductor element.

Herein, the boding was performed at a temperature of 110° C. and a pressure of 2 kg for 1 second.

Examples 2 to 5 and Comparative Examples 1 to 3

A resin composition solution for bonding semiconductors (solid content of 40 wt %) and an adhesive layer for a semiconductor with a thickness of 110 μm was obtained in the same manner as in Example 1, except that the components and amounts used in Table 1 were applied.

TABLE 1

Composition of the resin compositions of the examples and comparative examples [unit: g]

| | | Example 1 | Example 2 | Example 3 | Example 4 | Example 5 | Comparative Example 1 | Comparative Example 2 | Comparative Example 3 |
|---|---|---|---|---|---|---|---|---|---|
| Phenol resin | KH-6021 | 60 | 60 | 60 | | 30 | | | 60 |
| | KPH-3075 | | | | 60 | | 30 | | |
| | GPH-65 | | | | | 30 | 30 | 36 | |

TABLE 1-continued

Composition of the resin compositions of the examples and comparative examples [unit: g]

| | | Example 1 | Example 2 | Example 3 | Example 4 | Example 5 | Comparative Example 1 | Comparative Example 2 | Comparative Example 3 |
|---|---|---|---|---|---|---|---|---|---|
| Epoxy resin | RE-310S | 40 | 30 | 20 | 30 | 30 | 5 | 25 | 60 |
| | EOCN-104S | | | 10 | | 20 | | 15 | |
| | HP-7200 | | | | 26 | | | | |
| | KDS-8170 | | 15 | | | | | | |
| | SEJ-01R | 26 | 15 | 30 | 10 | 20 | 80 | 2 | 5 |
| Acryl resin | Preparation Example | 20 | 20 | 20 | 20 | 20 | 20 | 20 | 20 |
| Curing accelerator | 2PZ | 0.2 | 0.2 | 0.2 | 0.2 | 0.2 | 0.2 | 0.2 | 0.2 |
| Coupling agent | KBM-403 | 1 | 1 | 1 | 1 | 1 | 1 | 1 | 1 |
| Filler | SC-2050 | 50 | 50 | 50 | 50 | 50 | 50 | 50 | 100 |
| Rheology modifier | R-972 | | | | | | | | 10 |

KDS-8170: Liquid epoxy resin (Kukdo Chemical, bisphenol F epoxy resin, epoxy equivalent: 157 g/eq, viscosity [25° C.]: 1500 mPa · s)
Epoxy resin EOCN-104S (NIPPON KAYAKU, Cresol novolac type epoxy resin, epoxy equivalent: 214 g/eq, softening point: 92° C.)
HP-7200 (DIC, epoxy equivalent: 257 g/eq, softening point: 61° C.)
R-972 (EvoniK Industries, fumed silica, average particle diameter: 17 nm)
KPH-F3075 (KOLON CHEMICAL, hydroxyl equivalent: 175 g/eq, softening point: 75° C.)
GPH-65 (NIPPON KAYAKU, hydroxyl group equivalent: 198 g/eq, softening point: 65° C.)
NMA (Kukdo Chemical, acid anhydride curing agent, liquid)

EXPERIMENTAL EXAMPLES

Evaluation of Physical Properties of Adhesive Layers for Semiconductors

Experimental Example 1

Measurement of Melt Viscosity

The adhesive layers respectively obtained in the examples and comparative examples were overlapped and laminated using a roll laminator at 60° C. until the thickness reached 660 μm.

Then, specimens were cut in a circular shape having a diameter of 8 mm and melt viscosities thereof with respect to temperature were measured at a shear rate of 5 rad/sec at a heating rate of 20° C./min by using an advanced rheometric expansion system (ARES) of TA INSTRUMENTS.

Experimental Example 2

Measurement of Molding Properties of the First Semiconductor Element of the Second Adhesive Layer Similarly to the example regarding the preparation of semiconductor device, the semiconductor devices were manufactured by thermally curing the adhesive film by heat-treating the BGA substrate to which the second semiconductor element was adhered in a pressure dryer at 135° C. for 1 hour at 7 atm.

The manufactured semiconductor device was cut and the cut surface was observed using an optical microscope (200×). The evaluation was performed by marking "○" for the case in which the semiconductor device was well embedded without voids around the periphery of the first semiconductor element, and "×" for the case in which voids were observed around the periphery of the first semiconductor element.

Experimental Example 3

Measurement of Molding Properties for Flip-chip Connection

Semiconductor devices were manufactured in the same manner as in the above experimental example, and it was confirmed whether or not the space between the first semiconductor and the adherent or the periphery of the solder bump was embedded by utilizing an X-ray inspection apparatus.

The case in which the space between the first semiconductor element and the adherent inside the semiconductor device or the periphery of the solder bump is well embedded without voids was evaluated as "○", indicating excellent molding properties around the periphery of the flip chip connection part, and the case in which voids were observed in the space between the first semiconductor element and the adherent or in the periphery of the solder bumps was evaluated as "×", indicating poor molding properties around the periphery of the flip chip connection part.

Experimental Example 4

Reliability Evaluation (Brecon TEST)

The semiconductor device was manufactured in the same manner as in the Experimental Example 2, and then continuous curing was further performed at 175° C. for 2 hour.

After the curing, the substrate was exposed at 85° C. and 85% RH for 48 hour, an IP reflow process was performed three times, and the degree of peeling between the substrate and the adhesive was observed through the naked eye and Scanning Acoustic Tomography (SAT).

Experimental Example 5

Measurement of Amounts of Fillets

Semiconductor devices were manufactured in the same manner as in Experimental Example 2 above, and amounts of the adhesives spreading out from the periphery of the second semiconductor element were measured. After measuring the longest adhesive per semiconductor element, a length of 300 μm or less was evaluated as "○", indicating excellent fillet properties, and a length of greater than 300 μm was evaluated as "×" indicating poor fillet properties.

TABLE 2

Results of Experimental Examples

|  | Example 1 | Example 2 | Example 3 | Example 4 | Example 5 | Comparative Example 1 | Comparative Example 2 | Comparative Example 3 |
|---|---|---|---|---|---|---|---|---|
| Melt viscosity at 110° C. [shear rate: 5 rad/sec] | 550 | 300 | 50 | 1100 | 730 | 30 | 27,000 | 13,500 |
| Thixotropic index at 110° C. | 3.5 | 3.2 | 3.0 | 4.5 | 4.0 | 0.5 | 6.1 | 8.5 |
| Molding properties of the first semiconductor element | ○ | ○ | ○ | ○ | ○ | ○ | X | X |
| Molding properties around the periphery of the flip-chip connection part | ○ | ○ | ○ | ○ | ○ | ○ | X | X |
| Rate of occurrence of peeling | 0% | 0% | 0% | 0% | 0% | 0% | 80% | 95% |
| Measurement of amount of fillets | ○ | ○ | ○ | ○ | ○ | X | ○ | ○ |

Thixotropic index: the ratio of the melt viscosity of the adhesive layer at a shear rate of 0.5 rad/sec and a temperature of 110° C. to the melt viscosity of the adhesive layer at a shear rate of 5 rad/sec and a temperature of 110° C.

As shown in Table 2 above, in the case of using the adhesive films for semiconductor elements of Examples 1 to 5, it was confirmed that a phenomenon in which an adhesive flows out from the second semiconductor chip at a high temperature in the bonding process of the second semiconductor element or a phenomenon in which the adhesive flows out around the edges of the semiconductor element to form fillets may be prevented, and that the first semiconductor substrate can be molded without voids, and further the molding properties around the periphery of the connecting portion of the first semiconductor element can be satisfactorily realized.

On the contrary, it was confirmed that in the case of the adhesive films prepared in Comparative Example 1, the adhesive excessively flows out around the edges of the second semiconductor element to form fillets, and that in the case of the adhesive films prepared in Comparative Examples 2 and 3, the performance of embedding the first semiconductor element is low, and particularly, voids remain around the periphery of the connecting portion of the first semiconductor element and thus a delamination phenomenon between the substrate and the adhesive occurs in the reflow process after high temperature curing and moisture absorption.

The invention claimed is:

1. A semiconductor device comprising:
   a first semiconductor element fixed onto an adherend by flip-chip connection;
   an adhesive layer for embedding a space between the adherend and the first semiconductor element and embedding the first semiconductor element; and
   a second semiconductor element connected to the first semiconductor element via the adhesive layer,
   wherein the adhesive layer has a melt viscosity of 10 to 10,000 Pa·s at a temperature of 110° C. and a shear rate of 5 rad/sec,
   wherein a thixotropic index defined by a ratio of the melt viscosity of the adhesive layer at a shear rate of 0.5 rad/sec and a temperature of 110° C. to the melt viscosity of the adhesive layer at a shear rate of 5 rad/sec and a temperature of 110° C. is 1.5 to 7.5, and
   wherein the adhesive film includes a thermoplastic resin having a glass transition temperature of −10° C. to 30° C., two or more kinds of liquid epoxy resins having different viscosities, and a curing agent including a phenol resin.

2. The semiconductor device of claim 1, wherein the adhesive layer for embedding a space between the adherend and the first semiconductor element and embedding the first semiconductor element may be a continuous phase.

3. The semiconductor device of claim 1, wherein the two or more kinds of liquid epoxy resins having different viscosities include a low viscosity liquid epoxy resin having a melt viscosity of 1 mPa·s to 500 mPa·s at 25° C.

4. The semiconductor device of claim 1, wherein the two or more kinds of liquid epoxy resins having different viscosities includes a high viscosity liquid epoxy resin having a melt viscosity of from 1000 mPa·s to 20,000 mPa·s at 25° C.

5. The semiconductor device of claim 1, wherein the adhesive layer includes a low viscosity liquid epoxy resin having a melt viscosity of 1 mPa·s to 500 mPa·s at 25° C., and a high viscosity liquid epoxy resin having a melt viscosity of 1000 mPa·s to 20,000 mPa·s at 25° C. at a weight ratio of 1:10 to 10:1.

6. The semiconductor device of claim 1, wherein the thermoplastic resin includes a (meth)acrylate-based resin including a (meth)acrylate-based repeating unit containing an epoxy-based functional group.

7. The semiconductor device of claim 1, wherein the (meth)acrylate-based resin includes 0.1 to 25% by weight of a (meth)acrylate-based repeating unit containing epoxy-based functional groups.

8. The semiconductor device of claim 1, wherein the adhesive layer further includes a solid epoxy resin.

9. The semiconductor device of claim 8, wherein
the solid epoxy resin has a softening point of 50° C. to 120° C.

10. The semiconductor device of claim 1, wherein the weight ratio of the two or more kinds of liquid epoxy resins having different viscosities to the phenol resin is 0.3 to 1.5.

11. The semiconductor device of claim 1, wherein the phenol resin has a softening point of 60° C. or higher.

12. The semiconductor device of claim 1, wherein the curing agent further includes at least one compound selected from the group consisting of an amine-based curing agent and an acid anhydride-based curing agent.

13. The semiconductor device of claim 1, wherein the adhesive layer may further include at least one selected from the group consisting of inorganic fillers and rheology modifiers.

14. The semiconductor device of claim 11, wherein
the rheology modifier includes at least one compound selected from the group consisting of silica with a diameter of less than 100 nm, bentonite-based compounds, ultra-fine precipitated calcium carbonates, organic bentonite-based compounds, surface-treated calcium carbonate-based compounds, metal soap-based compounds, hydrogenated castor oils, polyamide waxes, polyethylene oxide-based compounds, vegetable oils, polymer oils, flaxseed polymer oils, and fatty acid dimers.

15. The semiconductor device of claim 11, wherein
the inorganic filler includes at least one compound selected from the group consisting of silica with a diameter of 100 nm or greater, alumina, barium sulfate, magnesium hydroxide, magnesium carbonate, magnesium silicate, magnesium oxide, calcium-based compounds such as calcium silicate, calcium carbonate, calcium oxide, alumina, aluminum hydroxide, aluminum nitride, aluminum borate, whiskers, zirconium-based compounds, and antimony bismuth-based compounds.

16. The semiconductor device of claim 1, wherein the adhesive layer further includes 10 to 50% by weight of an inorganic filler.

17. The semiconductor device of claim 1, wherein
the distance from one surface of the adherend to one surface of the second semiconductor element is 10 μm to 1000 μm.

18. A method of manufacturing a semiconductor device, comprising the steps of: embedding a space between an adherend and a first semiconductor element fixed onto the adherend by flip-chip connection and embedding the first semiconductor element with an adhesive for a semiconductor; and
bonding the second semiconductor element onto the adhesive for a semiconductor,
wherein the adhesive for a semiconductor has a melt viscosity of 10 to 10,000 Pa·s at a temperature of 110° C. and a shear rate of 5 rad/sec,
wherein a thixotropic index defined by a ratio of the melt viscosity of the adhesive at a shear rate of 0.5 rad/sec and a temperature of 110° C. to the melt viscosity of the adhesive at a shear rate of 5 rad/sec and a temperature of 110° C. is 1.5 to 7.5,and
wherein the adhesive includes a thermoplastic resin having a glass transition temperature of −10° C. to 30° C., two or more kinds of liquid epoxy resins having different viscosities, and a curing agent including a phenol resin.

19. The method of manufacturing a semiconductor device of claim 18, wherein
the step of embedding a space between an adherend and a first semiconductor element fixed onto the adherend by the flip-chip connection and embedding the first semiconductor element with the adhesive for a semiconductor
includes a step of simultaneously or sequentially embedding a space between the adherend and the first semiconductor element and embedding the first semiconductor element using only the adhesive for a semiconductor.

20. The method of manufacturing a semiconductor device of claim 18, wherein
the step of embedding a space between the adherend and the first semiconductor element and embedding the first semiconductor element using only the adhesive for a semiconductor
includes a step of bonding the second semiconductor element onto the adhesive for a semiconductor while a space between an adherend and a first semiconductor element fixed onto the adherend by the flip-chip connection and the first semiconductor element are embedded with the adhesive for a semiconductor, and then curing it at a temperature of 50 to 200° C. under pressure of 0.01 to 1.0 MPa.

* * * * *